(12) United States Patent
Shaked

(10) Patent No.: US 10,291,267 B2
(45) Date of Patent: May 14, 2019

(54) BAND-LIMITED DIGITAL PRE-DISTORTION (DPD) EXPANSION ESTIMATION AND CURVE ADJUSTMENT

(71) Applicant: MaxLinear, Inc., Carlsbad, CA (US)

(72) Inventor: Elad Shaked, San Diego, CA (US)

(73) Assignee: MAXLINEAR, INC., Carlsbad, CA (US)

( * ) Notice: Subject to any disclaimer, the term of this patent is extended or adjusted under 35 U.S.C. 154(b) by 0 days.

(21) Appl. No.: 15/228,430

(22) Filed: Aug. 4, 2016

(65) Prior Publication Data

US 2017/0047965 A1 Feb. 16, 2017

Related U.S. Application Data

(60) Provisional application No. 62/203,234, filed on Aug. 10, 2015.

(51) Int. Cl.
*H03F 1/32* (2006.01)
*H03F 3/24* (2006.01)
*H04B 1/04* (2006.01)

(52) U.S. Cl.
CPC ......... *H04B 1/0475* (2013.01); *H03F 1/3241* (2013.01); *H03F 1/3247* (2013.01); *H03F 3/24* (2013.01)

(58) Field of Classification Search
CPC ........ H03F 1/32; H03F 1/3241; H03F 1/3247; H03F 1/3264; H03F 1/3276; H03F 3/20; H03F 3/24; H04B 1/0475; H04B 2001/0408; H04B 2001/0416; H04B 2001/0425; H04B 2001/0433; H04L 27/36; H04L 27/367; H04L 27/368

USPC ....... 375/254, 285, 295–297; 381/94.1, 94.2, 381/94.3, 94.7, 94.8; 455/501, 67.13, 69, 455/114.2, 114.3
See application file for complete search history.

(56) References Cited

U.S. PATENT DOCUMENTS

| | | | |
|---|---|---|---|
| 6,614,854 B1 * | 9/2003 | Chow | H04L 1/0016 330/302 |
| 8,699,620 B1 * | 4/2014 | Wu | H03F 1/3247 375/254 |
| 2004/0232985 A1 * | 11/2004 | Itahara | H03F 1/3247 330/149 |
| 2005/0001684 A1 * | 1/2005 | Braithwaite | H03F 1/3247 330/263 |
| 2008/0130789 A1 * | 6/2008 | Copeland | H03F 1/3247 375/297 |
| 2010/0239047 A1 * | 9/2010 | Takayashiki | H03F 1/3247 375/296 |
| 2013/0165060 A1 * | 6/2013 | Jian | H03H 11/04 455/114.3 |

(Continued)

*Primary Examiner* — Young T Tse
(74) *Attorney, Agent, or Firm* — McAndrews, Held & Malloy, Ltd.

(57) ABSTRACT

Systems and methods are provided for band-limited digital pre-distortion (DPD) expansion estimation and curve adjustment. Pre-distortion adjustments may be applied during processing of an input signal, and expansion introduced as result of applying the pre-distortion adjustments may then be estimated. Expansion adjustments may then be determined based on the estimated expansion, and the expansion adjustments may be applied in a feedback manner during subsequent processing operations.

15 Claims, 7 Drawing Sheets

(56) References Cited

U.S. PATENT DOCUMENTS

2014/0118066 A1\* 5/2014 Lee .......................... H03F 3/24
                                                    330/149
2014/0194073 A1\* 7/2014 Wyville ................ H04B 1/525
                                                    455/73

\* cited by examiner

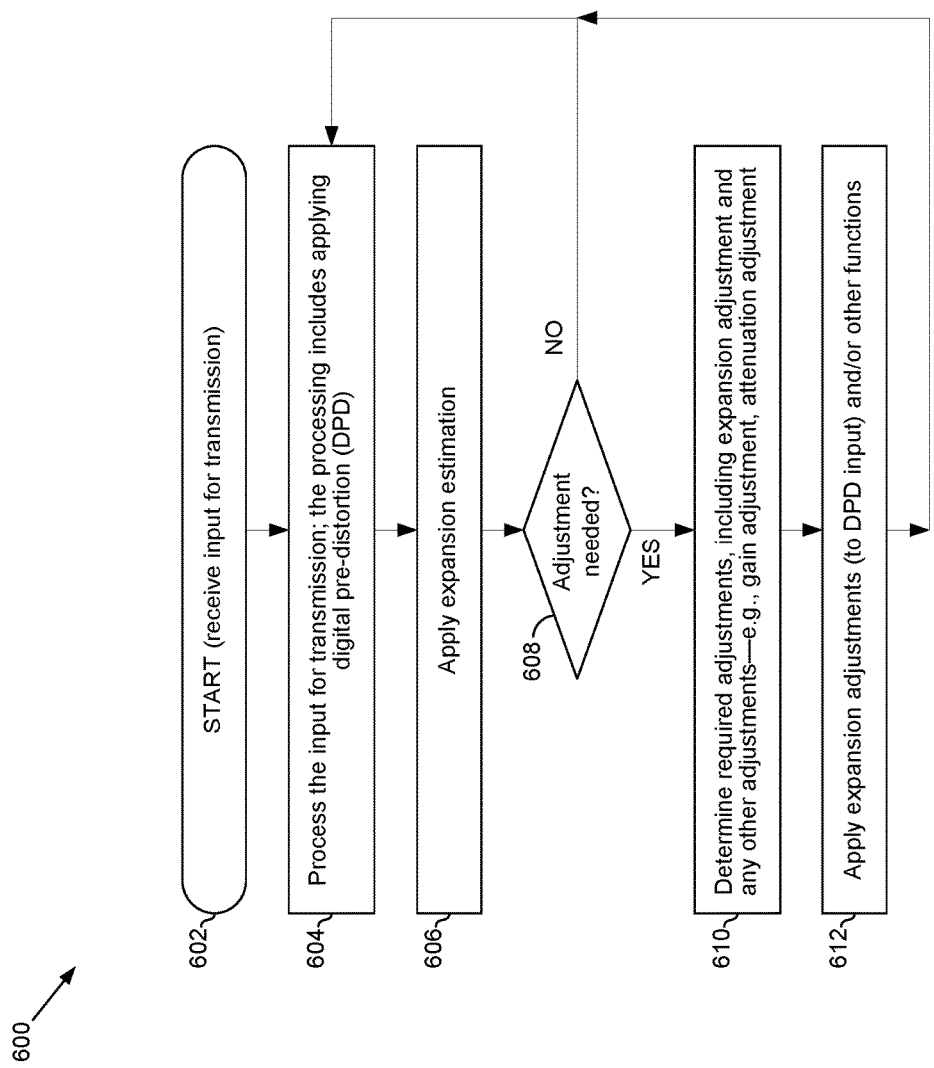

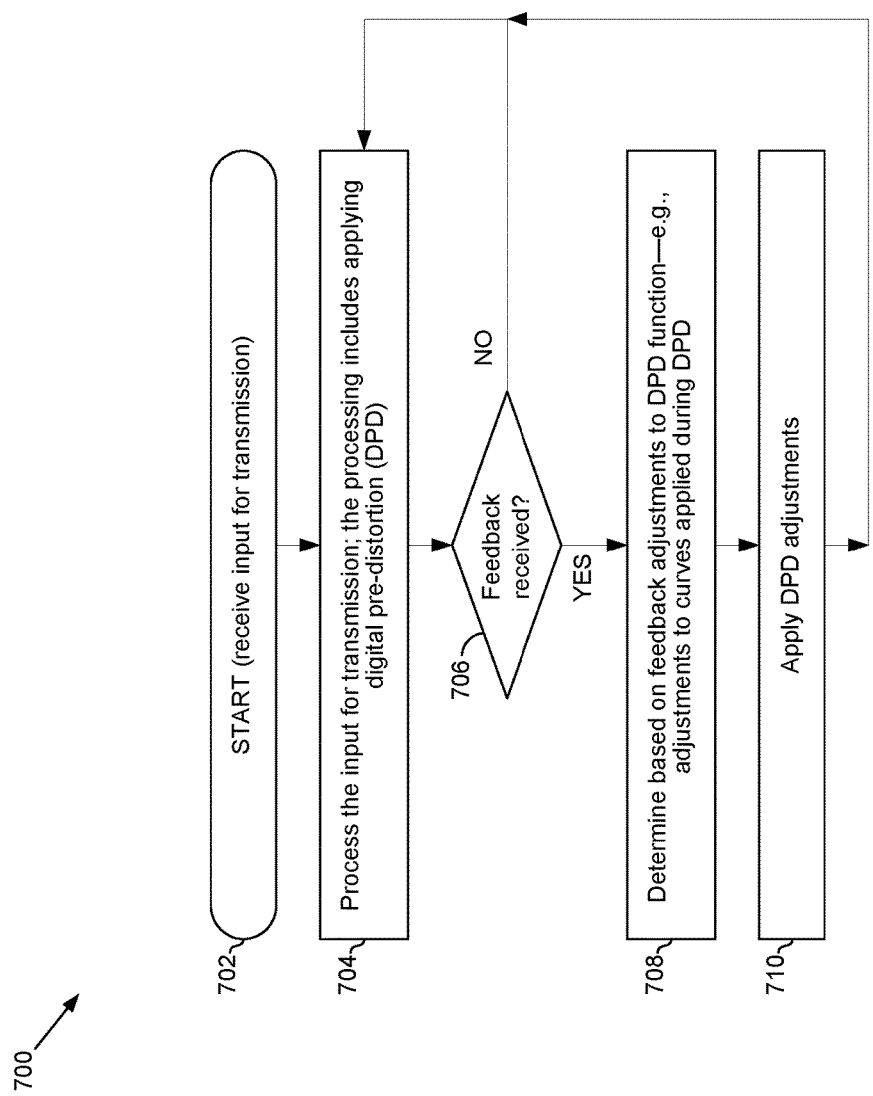

BAND-LIMITED DIGITAL PRE-DISTORTION (DPD) EXPANSION ESTIMATION AND CURVE ADJUSTMENT

CLAIM OF PRIORITY

This patent application makes reference to, claims priority to and claims benefit from U.S. Provisional Patent Application Ser. No. 62/203,234, filed Aug. 10, 2015. The above identified application is hereby incorporated herein by reference in its entirety.

TECHNICAL FIELD

Aspects of the present disclosure relate to signal processing. More specifically, various implementations of the present disclosure relate to band-limited digital pre-distortion (DPD) expansion estimation and curve adjustment.

BACKGROUND

Conventional approaches for implementing and/or utilizing digital pre-distortion (DPD), and/or in addressing issues relating thereto, may be costly, cumbersome, inefficient, and/or inaccurate—e.g., they may be complex, time consuming, resource intensive, and/or may introduce errors or distortion. Further limitations and disadvantages of conventional and traditional approaches will become apparent to one of skill in the art, through comparison of such systems with some aspects of the present disclosure as set forth in the remainder of the present application with reference to the drawings.

BRIEF SUMMARY

System and methods are provided for band-limited digital pre-distortion (DPD) expansion estimation and curve adjustment, substantially as shown in and/or described in connection with at least one of the figures, as set forth more completely in the claims.

These and other advantages, aspects and novel features of the present disclosure, as well as details of an illustrated embodiment thereof, will be more fully understood from the following description and drawings.

BRIEF DESCRIPTION OF SEVERAL VIEWS OF THE DRAWINGS

FIG. 6 illustrates a flowchart of an example process for utilizing expansion estimation in conjunction with digital pre-distortion (DPD), in accordance with the present disclosure.

FIG. 7 illustrates a flowchart of an example process for utilizing digital pre-distortion (DPD) curve adjustment based on feedback, in accordance with the present disclosure.

DETAILED DESCRIPTION OF THE INVENTION

As utilized herein the terms "circuits" and "circuitry" refer to physical electronic components (e.g., hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set $\{(x), (y), (x, y)\}$. In other words, "x and/or y" means "one or both of x and y." As another example, "x, y, and/or z" means any element of the seven-element set $\{(x), (y), (z), (x, y), (x, z), (y, z), (x, y, z)\}$. In other words, "x, y and/or z" means "one or more of x, y, and z." As utilized herein, the term "exemplary" means serving as a non-limiting example, instance, or illustration. As utilized herein, the terms "for example" and "e.g.," set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

Figure 1:
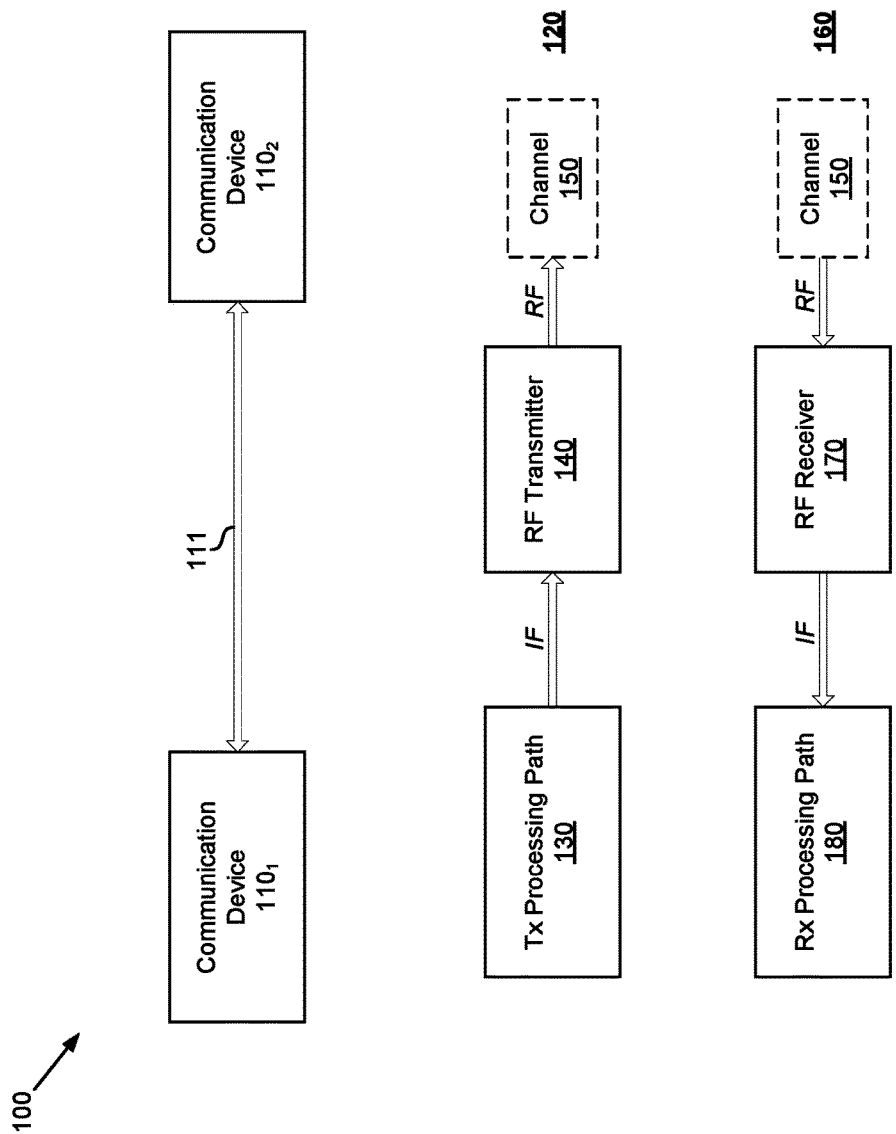
FIG. 1 illustrates an example communication setup in which digital pre-distortion (DPD) may be utilized.

FIG. 1 illustrates an example communication setup in which digital pre-distortion (DPD) may be utilized. Shown in FIG. 1 is a communication setup 100, comprising communication systems $110_1$ and $110_2$.

Each of the communication systems $110_1$ and $110_2$ may comprise suitable circuitry for enabling communication over wired and/or wireless connections. In this regard, the communication systems 100 may support a plurality of wired and/or wireless interfaces and/or protocols, and may be operable to perform necessary processing operations to facilitate transmission and/or reception of signals (e.g., RF signals) over supported wired and/or wireless interfaces.

In some instances, the communication systems $110_1$ and $110_2$ may be two separate electronic devices (or components thereof). Examples of electronic devices may comprise cellular and smart phones or similar handheld devices, tablets, personal computers, laptops or notebook computers, servers, personal media players, personal digital assistants, set top boxes, satellite receivers, wireless access points, cellular base stations, etc. In other instances, however, the communication systems $110_1$ and $110_2$ may be components within the same electronic device, configured to communicate with one another via particular internal interface. The disclosure is not limited, however, to any particular type of communication system, and the various implementation described in this disclosure may apply to any electronic platform which may be operable to communicate (transmit and/or receive) signals.

Examples of wireless standards, protocols, and/or interfaces which may be supported and/or used by the communication systems $110_1$ and $110_2$ for communication therebetween may comprise wireless personal area network (WPAN) protocols (e.g., as Bluetooth (IEEE 802.15) and ZigBee), near field communication (NFC) standards, wireless local area network (WLAN) protocols (e.g., such as WiFi (IEEE 802.11) standards), cellular standards (including 2G/2G+, such as GSM/GPRS/EDGE, IS-95 or cdmaOne, etc., and 3G/3G+, such as CDMA2000, UMTS, and HSPA, etc.), 4G standards (e.g., WiMAX (IEEE 802.16) and LTE), Ultra-Wideband (UWB), Extremely High Frequency (EHF, such as 60 GHz) Digital TV Standards (e.g., DVB-T/DVB-H, and ISDB-T), etc.

Examples of wired standards, protocols, and/or interfaces which may be supported and/or used by the communication systems $110_1$ and $110_2$ for communication therebetween may comprise Ethernet (IEEE 802.3), Digital Subscriber Line (DSL), Integrated Services Digital Network (ISDN), Fiber Distributed Data Interface (FDDI), cable television and/or internet access standards (e.g., ATSC, DVB-C, DOCSIS, etc.), in-home distribution standards such as Multimedia over Coax Alliance (MoCA), Universal Serial Bus (USB) based standards/protocols/interfaces, etc.

In operation, the communication systems $110_1$ and $110_2$ may communicate with each other, such as via one or more connections and/or links (e.g., connection/link 111). The connection/link 111 may be unidirectional, allowing for communications in only one direction (e.g., from the communication system $110_1$ to the communication system $110_2$); or may be bidirectional, allowing for communications in both directions—that is, from the communication system $110_1$ to the communication system $110_2$, and from the communication system $110_2$ to the communication system $110_1$). In this regard, bidirectional communications may be concurrent—that is, the communication system $110_1$ may be transmitting the communication system $110_2$ while the communication system $110_2$ is also transmitting to the communication system $110_1$.

The communications between the communication systems $110_1$ and $110_2$, such as over the connection/link 111, may comprise transmission and reception of signals (e.g., RF signals), which may be utilized to carry data communicated between the communication systems $110_1$ and $110_2$. The signals may be setup, configured, and/or utilized in accordance with corresponding wired and/or wireless interfaces, protocols, and/or standards. In this regard, the communication systems $110_1$ and $110_2$ may comprise suitable components configured to perform various functions or operations to facilitate the transmission and reception of signals, particularly RF signals. A simplified RF transmission and reception model is illustrated in FIG. 1.

At transmitter-side 120, a transmit (Tx) processing path 130 may be used to generate intermediate frequency (IF) signals. The Tx processing path 130 may comprise suitable circuitry for generating the IF signals, such as based on digital input (data) that is intended to be carried and/or embedded in the communicated signals. For example, the Tx processing path 130 may comprise circuits for performing such functions as modulation, digital-to-analog conversion, mixing, power amplification, etc. The IF signals generated by the Tx processing path 130 may then be sent to a RF transmitter 140, which may comprise suitable circuitry (and other suitable component—e.g., antennas and the like) for generating and transmitting radio frequency (RF) signals, such as based on IF signals provided thereto. The RF signals are then communicated over a RF channel 150.

At receiver-side 160, the RF signals may be received from the channel 150 via a RF receiver 170, which may comprise suitable circuitry (and other suitable component—e.g., antennas and the like) for receiving radio frequency (RF) signals, and apply suitable processing thereof, such as to generate corresponding intermediate frequency (IF) signals. The IF signals are then sent to a receive (Rx) processing path 180, which may comprise suitable circuitry for processing IF signals, such as to extract data carried and/or embedded therein (e.g., the digital data embedded into the RF signals at the transmitter-side). For example, the Rx processing path 180 may comprise circuits for performing such functions as low-noise amplification, mixing, digital-to-analog conversion, demodulation, etc.

In some instances, digital pre-distortion (DPD) may be used in communication setups, such as the communication setup 100 of FIG. 1. Pre-distortion, including digital pre-distortion (DPD), may be used in communication systems to mitigate and/or counteract distortion that may be introduced during communications, such as because of certain characteristics (e.g., nonlinearity) of certain components (e.g., power amplifiers) used during communication-related operations. In this regard, power amplifiers may typically be the last circuit and/or amplification step in a signal chain (the output stage), and as such the functions (e.g., characteristics thereof) of the power amplifiers may have very important effects on the transmission and quality (e.g., distortion) therein.

For example, nonlinear behavior in power amplifiers during transmissions may result in spectral growth beyond (assigned) signal bandwidth, which may result in interference with adjacent signals/channels. It may also cause distortions within the signal bandwidth, which may affect performance (e.g., decreasing the bit error rate at the receiver-side). Such distortion (e.g., nonlinear-based) may be particularly problematic in conjunction with particular transmission schemes or formats, such as for example with wideband code division multiple access (WCDMA) or orthogonal frequency division multiplexing (OFDM) based communications, due to high peak-to-average power ratios (PAPRs). While such distortion may be addressed by simply backing-off input signals, to achieve (or remain within) required linearity, such approach may not be desirable for other reasons (e.g., power amplifier efficiency will be very low for high PAPR signals).

Thus, the distortion may be remedied or reduced by use of particular linearization techniques to linearize operations of nonlinear components (e.g., power amplifiers). Digital pre-distortion is one of these techniques. In this regard, pre-distortion may be used to preemptively counteract anticipated distortion by introduction of an adjustment (a "pre-distortion") into inputs to nonlinear components (e.g., power amplifiers) which may be specifically configured to counteract the anticipated distortion that would be introduced due to the nonlinearity of remaining components in the transmit path. In other words, pre-distortion is applied to the input to specifically cancel out in the output distortion caused by nonlinearity in the transmit path.

A basic pre-distortion scheme may comprise monitoring output of nonlinear power component (which may be operating, in some implementation, in response to particular pre-selected test input—e.g., comprising pre-determined samples), and then estimating distortions caused by and/or introduced as result of nonlinearity of the component. These estimated distortions may be then addressed by pre-distorting the inputs such that no (or weak—e.g., less than a specified target) distortions appear at the output of the distorter.

There may be, however, certain risks and/or issues associated with use of digital pre-distortion. For example, use of PDP may raise expansion-related issues, such as due to errors or inaccuracies associated with transmission power. In this regard, transmit (Tx) power can be measured with limited accuracy. Output power tolerance at the transmit-side may need to meet certain criteria. For example, power tolerance may be specified as +/−2 dB for operating frequency bands of 3 to 30 GHz, and +/−3 dB for operating frequency bands equal or greater than 31 GHz. Such Tx gain uncertainty may result in over or under (over/under) expanding of the signal as a result of the digital pre-distortion applied in the transmit path. For example, Tx power measured 2 dB below actual level will result in under expansion. In fact, since open loop DPD typically under-expands by 2 dB (as a precaution), 4 dB under expansion may occur in the worst case.

Accordingly, in various implementations in accordance with the present disclosure, communication systems (or components thereof) may be configured to improve and/or optimize use of digital pre-distortion (DPD). This may be achieved by, for example, incorporating use of expansion estimation to eliminate or reduce expansion-type errors (e.g., over/under expansion) that may be introduced due to the use of DPD. In some implementations, DPD may be also enhanced by use of other measures, such as DPD curve adjustments. In this regard, DPD curve adjustments may be done based on feedback from the receiver-side. Examples of such implementations and/or techniques used in enhancing and/or optimizing DPD are described in more details below.

Figure 2:
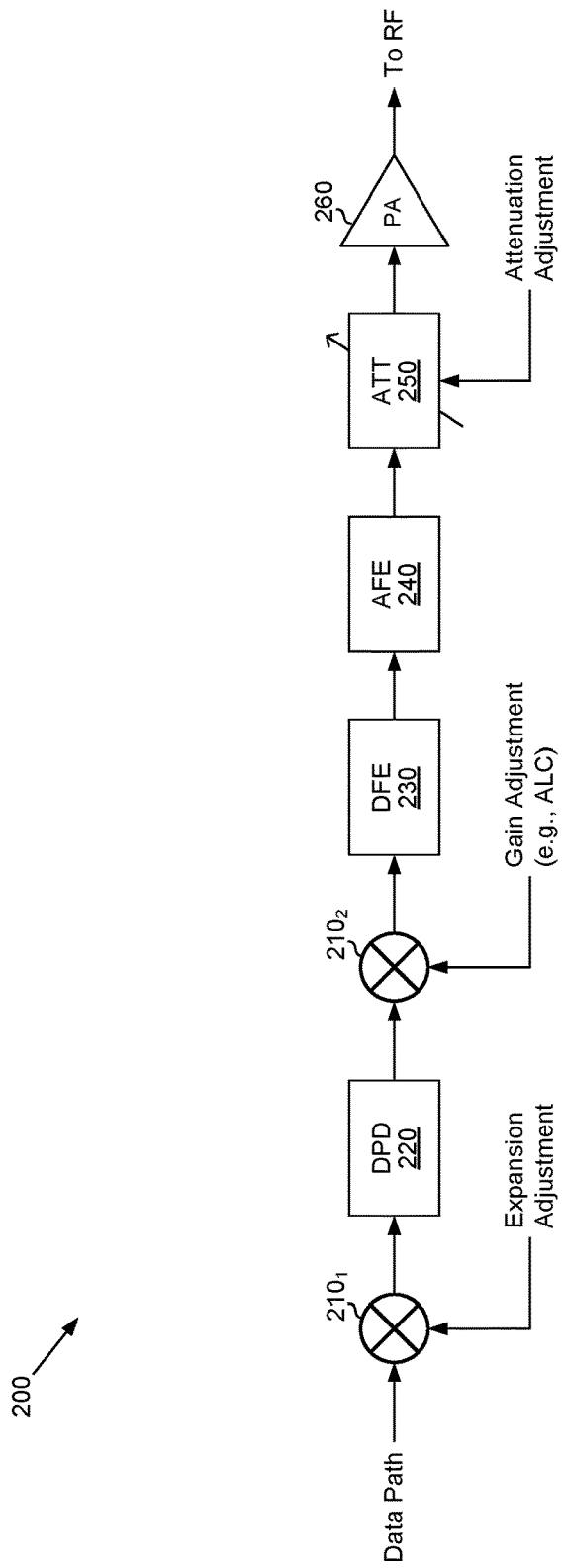
FIG. 2 illustrates an example transmitter that supports band-limited digital pre-distortion (DPD) expansion estimation, in accordance with the present disclosure.

FIG. 2 illustrates an example transmitter that supports digital pre-distortion (DPD) band-limited expansion estimation, in accordance with the present disclosure. Shown in FIG. 2 is transmitter 200.

The transmitter 200 may comprise suitable circuitry for transmitting signals, and particularly for performing various processing functions association with facilitating such transmission. The transmitter 200 may correspond to (or be a component of) either of the communication systems $110_1$ and $110_2$ (specifically when representing the transmit-side). The transmitter 200 (or the portion thereof shown in FIG. 2) may be operable to apply digital pre-distortion (DPD) during transmissions, and to additionally support band-limited DPD expansion estimation. As shown in the example implementation depicted in FIG. 2, the transmitter 200 may comprise multiplier circuits $210_1$ and $210_2$, a digital pre-distortion (DPD) circuit 220, a digital front-end (DFE) circuit 230, an analog front-end (AFE) circuit 240, an attenuator (ATT) circuit 250, and power amplifier (PA) circuit 260.

Each of the multiplier circuits $210_1$ and $210_2$ may be operable to multiply two (or more) input signals.

The DPD circuit 220 may be operable to apply digital pre-distortion, as described with respect to FIG. 1 for example.

The DFE circuit 230 may be operable to perform and/or apply various digital signal conditioning functions, to facilitate transmission of corresponding signals—e.g., over-the-air radio frequency (RF) signals The AFE circuit 240 may be operable to perform and/or apply various analog signal conditioning functions, to enable generation of analog signals—e.g., suitable for transmission, such as over-the-air analog radio frequency (RF) signals.

The ATT circuit 250 may be operable to attenuate an input signal—e.g., to reduce the power of the signal, and to do so without appreciably distorting its waveform.

The PA circuit 260 may be operable to amplify its input (signal). As noted above, the power amplifier typically may be the last amplifier or actual circuit in a signal chain (e.g., represent the output stage).

As described in more detail above, with respect to FIG. 1, digital pre-distortion (DPD) may be applied in the transmit path to preemptively counteract (remove, or at least substantially reduce) distortion that will be introduced into the output as result of the nonlinearity of particular components (e.g., the PA circuit 260) in the transmit path. This may be done by introduction, via the DPD circuit 220, an adjustment (pre-distortion) into the digital input. In this regard, this adjustment (pre-distortion) may be particularly determined and/or configured based on the nonlinearity characteristics of the particular components.

As noted above, however, in some instances use of digital pre-distortion may result in expansion related issues—e.g., over/under expansion of the output signal, due to limited accuracy in measured transmit power. Thus, the transmitter 200 may be configured to address such expansion issues. For example, over/under expansion may be remedied (or reduced) by applying an expansion adjustment—e.g., applied as a multiplicative factor, via the multiplier circuit $210_1$, to the DPD input (input to the DPD circuit 220). The expansion adjustments may be determined adaptively and/or dynamically (e.g., by a main processor or a controller circuit 270, or alternatively by the DPD circuit 220 itself). For example, the expansion adjustments may be determined based on expansion estimations, as described in more detail below.

In some implementations, additional adjustments may be applied in the transmit path to further enhance expansion handling (and/or to account for the introduction of the expansion adjustments). For example, gain adjustment (e.g., automatic level control (ALC) based adjustment) may be applied as multiplicative factor (e.g., via the multiplier circuit $210_1$) to the DPD output (output of the DPD circuit 220). An attenuation adjustment may also be applied via the ATT circuit 250.

As noted above, expansion adjustments may be determined adaptively, such as based on expansion estimations. In an example implementation, band-limited expansion estimation may be used. In this regard, over/under expansion may be determined by extracting a non-linear response based on observing Tx/Rx band-limited signal and a training sequence, and then determining an amount of expansion (thus expansion adjustment) based on the extracted non-linear response.

For example, assuming the signal is synchronized and equalized to a reference, bandwidth constrained least squares model extraction may be performed as follows:

$$\min_{P\{\cdot\}}\{\|M \cdot \mathit{fft}\{P\{x\} - y\}\|^2\} \quad (1)$$

where P is the non-linear model (memoryless, complex coefficient); x is reference sequence (e.g., at 8 times the symbol rate (8 SR)); y is the Tx/Rx feedback/signal (e.g., at 8 SR), excluding the out-of-band content; fft is fast Fourier transform; and M is frequency domain mask, excluding the out-of-band content.

The above may also be applied to a non-band limited version of the Tx/Rx feedback/signal, but typically a synchronized and equalized counterpart will be available after miscellaneous filtering/down-sampling stages in a Tx/Rx feedback/signal chain.

The amount of expansion may then be determined by observing the extracted non-linear response. The expansion estimation may comprise sampling the gain curve, and then estimating below/above the curve. The estimation for the sample points may be determined as follows:

$$P(x) = \Sigma_q \mathrm{odd}\, a_q x^{|x|^{q-1}} \quad (2)$$

Assuming that $\{S_i\}_{i=1}^{N-1}$ sample points are used, e.g., ranging between 1 and PAPR minus BO (back-off), estimation sum, $\gamma$, may be determined as follows:

$$\gamma = \Sigma_i \{|P(s_i)|^2 - |a_1 s_i|^2\} \quad (3)$$

The estimation sum $\gamma$ may then be used in determining under/over estimation (e.g., based on being greater or lesser than zero, respectively). Further, the estimation sum γ may also be used as a measure of expansion.

Figure 3:
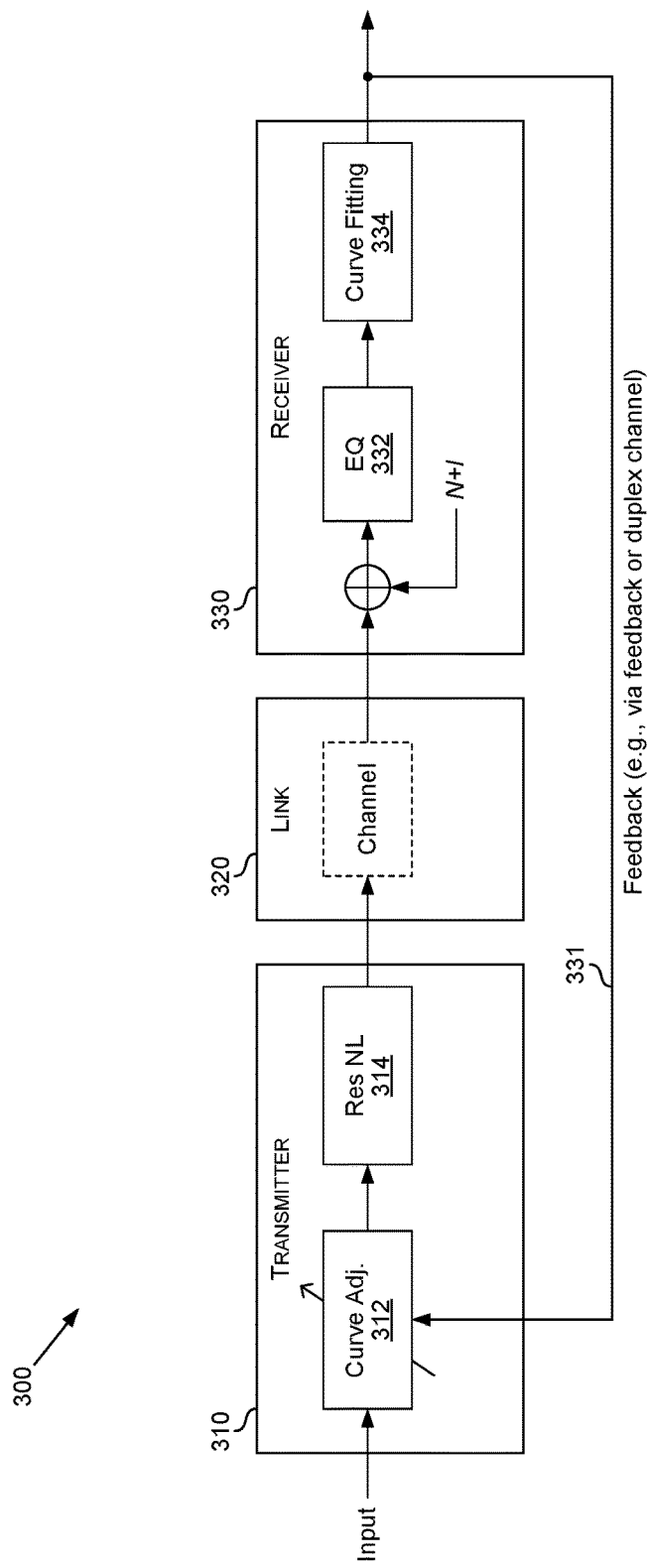
FIG. 3 illustrates an example communication setup that supports digital pre-distortion (DPD) curve adjustment, in accordance with the present disclosure.

FIG. 3 illustrates an example communication setup that supports digital pre-distortion (DPD) curve adjustment, in accordance with the present disclosure. Shown in FIG. 3 is communication setup 300, which comprises a transmitter 310, a receiver 330, and a link 320 between the transmitter 310 and the receiver 330.

The communication setup 300 may be substantially similar to the communication setup 100 of FIG. 1, with the transmitter 310, the link 320, and the receiver 330 corresponding to (at least portion of) and/or being substantially similar to communication systems $110_1$ and $110_2$ (and link 111 therebetween) in FIG. 1.

The communication setup 300, however, and elements therein (e.g., the transmitter 310 and the receiver 330) may comprise suitable circuitry for supporting digital pre-distortion (DPD) during transmissions (e.g., as described with respect to FIG. 1), and to particularly support DPD curve adjustments.

For example, as shown in the implementation depicted in FIG. 3, the transmitter 310 may comprise a curve adjustment circuit 312, which adjusts DPD curves used when applying digital pre-distortion in a circuit 314 used during transmission on a particular channel in the link 320. In this regard, the circuit 314 may exhibit a particular residual nonlinearity (res NL), which may be characterized by and/or be corrected using, for example, 11th order memoryless digital pre-distortion.

The receiver 330 may comprise an equalizer (EQ) circuit 332, and a circuit 334 which may be operable to apply band-limited (BL) curve fitting. The circuit 334 may be configured to apply 7th order memoryless function. Further, in some instances, during reception of signals at the receiver 330 one or both of noise and an interferer (N+I) may be added into the received signals. Thus, processing of the received signals may be configured to account for and/or remove (or mitigate) the N+I components or effects. This may be done, for example, during equalization in the EQ circuit 332, and/or during application of the BL curve fitting in the circuit 334.

In operation, the communication setup 300 may apply, such as during communications between the transmitter 310 and the receiver 330, digital pre-distortion (DPD), as described in more detail above, such as with respect to FIG. 1. Further, the communication setup may be operable to optimize and/or enhance digital pre-distortion, such as by use of DPD curve adjustments. The "curves" used in controlling and/or configuring DPD functions may be adjusted. For example, the curve adjustments may be based on feedback from the receiver-side. The receiver 330 may provide feedback, for example, after application of band-limited curve fitting via the circuit 334. The feedback may be provided via, for example, a feedback or duplex channel.

The same band-limited approach described above, with respect to FIG. 2, may be used in DPD curve adjustments. A band-limited approach, however, may be more valuable in the open loop DPD setups, where the loop can may be adjusted (or closed) via the receiver. Hence, in some implementations, in closed loop DPD setups the estimation process may be performed as described above, but using the entire expansion bandwidth.

Figure 4:
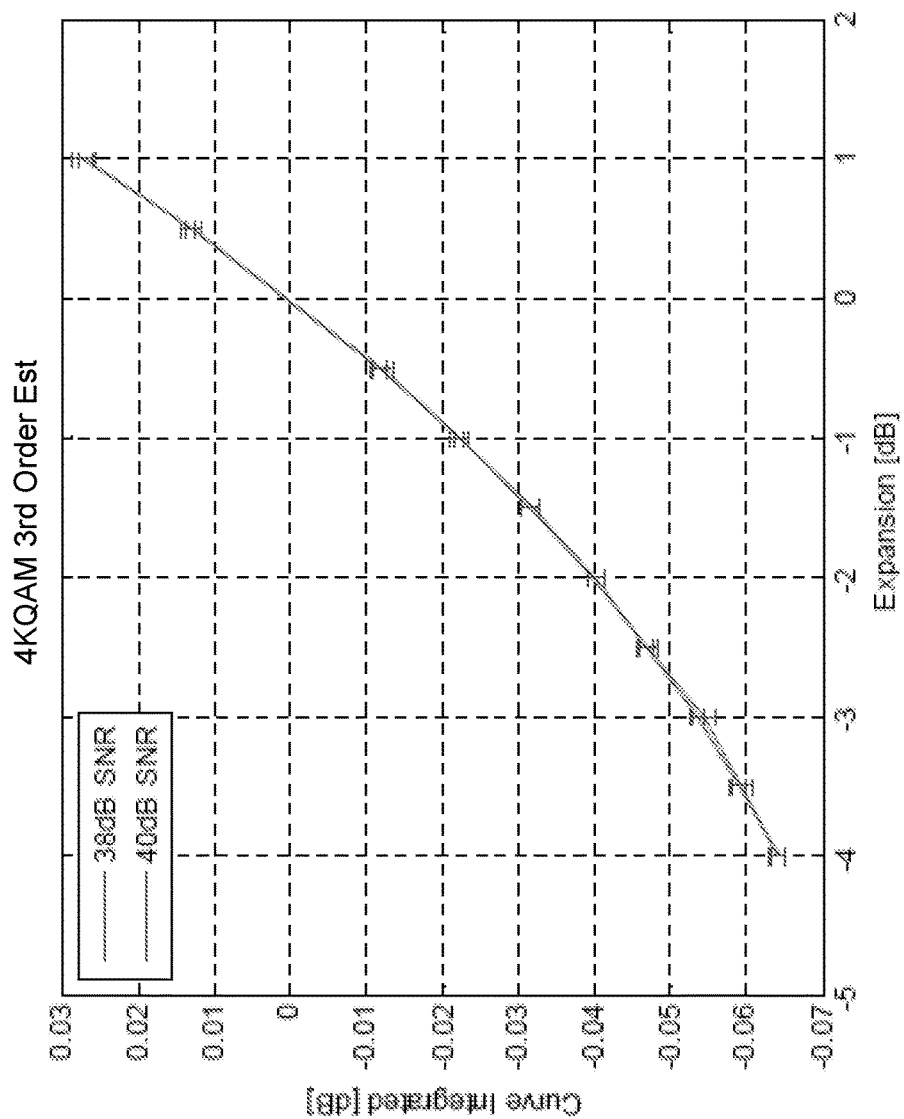
FIGS. 4 and 5 illustrate results of example digital pre-distortion (DPD) applications in accordance with the present disclosure.
Figure 5:
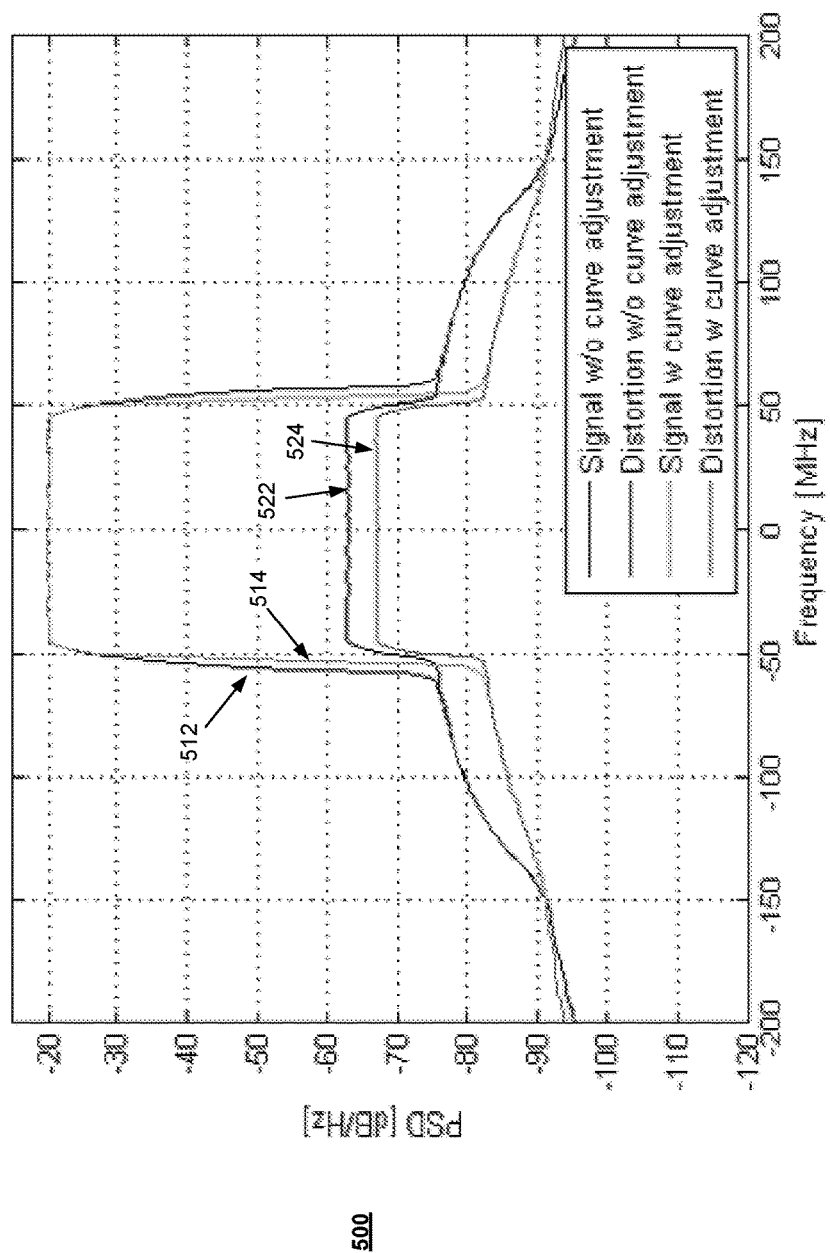

FIGS. 4 and 5 illustrate results of example digital pre-distortion (DPD) applications in accordance with the present disclosure.

Shown in FIG. 4 is a chart 400 illustrating expansion estimation, such as in AWGN (additive white Gaussian noise (AWGN), under particular operation conditions/characteristics—e.g., iterative LS, particular FFT size (e.g., 4096), particular number of symbols (e.g., 12^7), performed at 8 SR, BW estimation (e.g., (1+rolloff) SR)), 4KQAM SNRs {38,40} dB, etc.

In this regard, the X-axis in chart 400 represents expansion in dB (with positive values for over expansion and negative values for under expansion—e.g., −1 means 1 dB under expanded); and the Y-axis in chart 400 represents the result of applying the expansion estimation method, under the particular conditions and/or characteristics noted above. As can be seen, the curve crosses through the center of the coordinate system, which means that zeroing of the measure defined herein will result in the correct DPD set point.

Shown in FIG. 5 is a chart 500 illustrating improvement achieved in an example use scenario when applying DPD, particularly with curve adjustments. In this regard, chart 500 illustrates example power spectral density (as a function of frequency) when applying DPD, with band-limited (BL) expansion estimation, to a power amplifier. For example, as shown in FIG. 5, graph 512 corresponds to an example signal (being received) where no curve adjustments are made, and graph 522 corresponds to an example distortion (applicable during reception) where no curve adjustments are made.

On the other hand, graph 514 corresponds to the same signal (being received) with curve adjustment, and graph 524 corresponds to the same example distortion with curve adjustments. Accordingly, in the example scenario depicted in FIG. 5, use of curve adjustment may result in improvement in modulation error ratio (MER) from 43 dBs to 49 dBs during reception of the same signal.

FIG. 6 illustrates a flowchart of an example process for utilizing expansion estimation in conjunction with digital pre-distortion (DPD), in accordance with the present disclosure. Shown in FIG. 6 is flow chart 600, comprising a plurality of example steps (represented as blocks 602-612), for expansion estimation and applying adjustments based thereon during signal processing in which digital pre-distortion (DPD) is applied, such as in a suitable system (e.g., system 200 of FIG. 2), in accordance with the present disclosure.

In start step 602, input may be received for use in transmission. In this regard, the input may correspond to the data that is to be embedded into to-be transmitted signals.

In step 604, the received input may be processed, which may include performing required signal processing operations. In some instances this would entail applying digital pre-distortion (DPD), as explained above.

In step 606, expansion estimation may be performed, such as in accordance with the various implementations described above.

In step 608, it may be determined, based on the expansion estimation, whether adjustments may be needed. For example, adjustments may be needed when over/under estimation would occur. In instance where no adjustments are needed, the process may loop back to step 604; otherwise, the process may proceed to step 610.

In step 610, adjustments may be determined, such as based on the estimated estimation. The adjustments may include adjustments applicable to the digital pre-distortion (DPD) input (before application of DPD) and/or adjustment applied subsequent to the application of the DPD (e.g., gain adjustment, attenuation adjustment, etc.) as explained above.

In step 612, the determined adjustments may be applied. The process may then loop back to step 604, to continue transmission related operations.

FIG. 7 illustrates a flowchart of an example process for utilizing digital pre-distortion (DPD) curve adjustment based on feedback, in accordance with the present disclosure.

Shown in FIG. 7 is flow chart 700, comprising a plurality of example steps (represented as blocks 702-712), for digital pre-distortion (DPD) curve adjustments, based on feedback, during signal processing in which DPD is applied, such as in a suitable system (e.g., system 300 of FIG. 2), in accordance with the present disclosure.

In start step 702, input may be received for use in transmission. In this regard, the input may correspond to the data that is to be embedded into to-be transmitted signals.

In step 704, the received input may be processed, which may include performing required signal processing operations. In some instances this would entail applying digital pre-distortion (DPD), as explained above.

In step 706, it may be determined whether DPD related feedback is received from the receiver-side. In instances where no feedback is received, the process may loop back to step 704; otherwise, the process may proceed to step 708.

In step 708, adjustments to the DPD functions may be determined based on the feedback. The adjustments may include modifying curves used in DPD functions, as explained above.

In step 710, the DPD adjustments may be applied. The process may then loop back to step 704, to continue transmission related operations.

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the processes as described herein.

Accordingly, various embodiments in accordance with the present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip.

Various embodiments in accordance with the present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method comprising:
  applying during processing of an input signal, pre-distortion adjustment;
  estimating expansion introduced as result of applying the pre-distortion adjustment, wherein estimating the expansion comprises using band-limited expansion estimation, the band-limited expansion estimation comprising:
    extracting a non-linear response based on observing a transmit/receive (Tx/Rx) band-limited signal and a training sequence; and
    determining an amount of expansion based on the extracted non-linear response;
  generating expansion adjustment based on the estimated expansion; and
  applying the expansion adjustment in a feedback manner during subsequent processing operations.

2. The method of claim 1, further comprising applying one or more additional adjustments for handling the estimated expansion and/or to account for applying the expansion adjustments.

3. The method of claim 2, wherein the one or more additional adjustments comprise at least one of gain adjustment and attenuation adjustment.

4. The method of claim 1, wherein estimating the expansion comprises:
  sampling a gain curve; and
  estimating the expansion based on an assessment of positioning of sample points below or above the gain curve.

5. The method of claim 1, further comprising modifying the pre-distortion adjustment based on feedback received from a receiver-side.

6. The method of claim 5, further comprising modifying the pre-distortion adjustment by adjusting, based on the feedback received from the receiver-side, pre-distortion curves used when applying pre-distortion.

7. A system comprising:
  a transmitter comprising one or more circuits that are configured to:
    apply during processing of an input signal, pre-distortion adjustment;
    estimate expansion introduced as result of applying the pre-distortion adjustment, wherein estimating the expansion comprises use of band-limited expansion estimation, the one or more circuits being configured to, when using the band-limited expansion estimation:
      extract a non-linear response based on observing transmit/receive (Tx/Rx) band-limited signal and a training sequence; and
      determine an amount of expansion based on the extracted non-linear response;
    generate expansion adjustment based on the estimated expansion; and apply the expansion adjustment in a feedback manner during subsequent processing operations.

8. The system of claim 7, wherein the one or more circuits are further configured to apply one or more additional adjustments for handling the estimated expansion and/or to account for applying the expansion adjustments.

9. The system of claim 8, wherein the one or more additional adjustments comprise one or both of gain adjustment and attenuation adjustment.

10. The system of claim 7, wherein the one or more circuits are further configured to, when estimating the expansion:
sample a gain curve; and
estimate expansion based on an assessment of positioning of sample points below or above the gain curve.

11. The system of claim 7, wherein the one or more circuits are further configured to modify the pre-distortion adjustment based on feedback received from a receiver-side.

12. The system of claim 11, wherein the one or more circuits are further configured to modify the pre-distortion adjustment by adjusting, based on the feedback received from the receiver-side, pre-distortion curves used when applying pre-distortion.

13. A system comprising:
a pre-distortion circuit configured to apply pre-distortion adjustments during processing of signals for transmission; and
a controller circuit for controlling the pre-distortion adjustments applied via the pre-distortion circuit, wherein the controller circuit is configured to:
estimate expansion introduced as result of applying the pre-distortion adjustments, wherein the controller circuit is further configured to, when estimating the expansion:
extract a non-linear response based on observing a band-limited signal and a training sequence; and
determine an amount of expansion based on the extracted non-linear response; and
generate one or more adjustments based on the estimated expansion.

14. The system of claim 13, wherein the controller circuit is further configured to:
sample a gain curve; and
estimate the expansion based on an assessment of positioning of sample points below or above the gain curve.

15. The system of claim 13, wherein the controller circuit is further configured to modify the pre-distortion adjustments based on feedback received from a receiver-side.

* * * * *